(12) United States Patent
Buske et al.

(10) Patent No.: US 9,771,652 B2
(45) Date of Patent: Sep. 26, 2017

(54) METHOD FOR PASSIVATING A METAL SURFACE

(71) Applicants: PlasmaTreat GmbH, Steinhagen (DE); BSH Bosch und Siemens Hausgerate GmbH, Munich (DE)

(72) Inventors: Christian Buske, Bielefeld (DE); Maria Carmen Artal Lahoz, Saragossa (ES); Andres Escartin Barduzal, Saragossa (ES); Francisco Javier Ester Sola, Saragossa (ES); Francisco Javier Marco Lostao, Saragossa (ES); Elena Martinez Solanas, Saragossa (ES); Jose Ignacio Pena Torre, Saragossa (ES); Fernando Planas Layunta, Saragossa (ES)

(73) Assignee: PlasmaTreat GmbH, Steinhagen (DE)

( * ) Notice: Subject to any disclaimer, the term of this patent is extended or adjusted under 35 U.S.C. 154(b) by 268 days.

(21) Appl. No.: 14/388,493

(22) PCT Filed: Mar. 25, 2013

(86) PCT No.: PCT/EP2013/056220
§ 371 (c)(1),
(2) Date: Sep. 26, 2014

(87) PCT Pub. No.: WO2013/144065
PCT Pub. Date: Oct. 3, 2013

(65) Prior Publication Data
US 2015/0322572 A1 Nov. 12, 2015

(30) Foreign Application Priority Data
Mar. 29, 2012 (DE) .................. 10 2012 102 721

(51) Int. Cl.
*C23C 22/48* (2006.01)
*C23C 16/453* (2006.01)
(Continued)

(52) U.S. Cl.
CPC ............. *C23C 16/515* (2013.01); *C23C 4/11* (2016.01); *C23C 4/134* (2016.01); *C23C 8/36* (2013.01);
(Continued)

(58) Field of Classification Search
CPC .. C23C 8/36; C23C 4/11; C23C 4/134; C23C 22/07; C23C 22/24; C23C 22/76; C23C 16/515
See application file for complete search history.

(56) References Cited

U.S. PATENT DOCUMENTS 5,858,465 A 1/1999 Hunt et al.
6,800,336 B1 10/2004 Fornsel et al.
(Continued)

FOREIGN PATENT DOCUMENTS

EP 0653502 A2 5/1995
EP 1335641 A1 8/2003
(Continued)

*Primary Examiner* — Lois Zheng
(74) *Attorney, Agent, or Firm* — The Webb Law Firm

(57) ABSTRACT

A method for passivating a metal surface including, generating an atmospheric plasma beam by electrical discharge in a working gas, introducing an acid-containing passivating agent into the plasma beam, applying the plasma beam containing the passivating agent to the metal surface, and depositing a passivating salt on the metal surface by a reaction between the acid-containing passivating agent and the metal surface. This method simplifies the process for passivating a metal surface and renders it more effective.

11 Claims, 3 Drawing Sheets

(51) Int. Cl.
*C23C 16/515* (2006.01)
*C23C 22/07* (2006.01)
*C23C 22/24* (2006.01)
*C23C 22/76* (2006.01)
*C23C 8/36* (2006.01)
*C23C 4/11* (2016.01)
*C23C 4/134* (2016.01)
*C23C 22/00* (2006.01)

(52) U.S. Cl.
CPC .............. *C23C 22/07* (2013.01); *C23C 22/24* (2013.01); *C23C 22/76* (2013.01)

(56) References Cited

U.S. PATENT DOCUMENTS

| 2007/0026254 A1* | 2/2007 | Ben-Malek ............. C23C 22/78 428/651 |
| 2009/0061184 A1 | 3/2009 | Jaworowski et al. |
| 2012/0031765 A1 | 2/2012 | Curran et al. |

FOREIGN PATENT DOCUMENTS

| EP | 1230414 B1 | 10/2004 | |
| EP | 2194162 A2 | 6/2010 | |
| EP | 2460595 * | 6/2012 | ................ C22F 1/06 |
| EP | 2460595 A2 | 6/2012 | |
| FR | 853144 A | 3/1940 | |
| WO | 2010112914 A1 | 10/2010 | |

* cited by examiner

METHOD FOR PASSIVATING A METAL SURFACE

CROSS-REFERENCE TO RELATED APPLICATIONS

This application is the United States national phase of International Application No. PCT/EP2013/056220 filed Mar. 25, 2013, and claims priority to German Patent Application No. 10 2012 102 721.8 filed Mar. 29, 2012, the disclosures of which are hereby incorporated in their entirety by reference.

BACKGROUND OF THE INVENTION

Field of the Invention

The invention relates to a method for passivating a metal surface, in which a passivating agent is applied to the metal surface.

Description of Related Art

In the context of this description, passivation of a metal surface is understood to mean for example the application of a corrosion protection agent. Passivation may also include the application of an agent for reducing friction when processing a metal workpiece. Passivation of the metal surface may also refer to the reduction of electrical resistance, that is to say electrically insulating the metal surface.

One example of the passivation of a metal surface is phosphatizing, in which chemical reactions between metal surfaces and aqueous phosphate solutions form a so-called "conversion layer" from permanently adhering metal phosphates. Phosphatizing is mostly adopted with steel, but it can also be used for zinc or cadmium plated steels and aluminum. The main areas of application for this process are corrosion protection, adhesion promotion, friction and wear reduction, and electrical insulation.

In the phosphatizing procedure known from the prior art, the layer is formed by precipitation of poorly soluble salts of phosphoric acid, so-called phosphates, from an aqueous solution. Depending on the nature of the solution, the layers formed may thus contain phosphates of iron, zinc or manganese.

In the phosphatizing procedure that does not result in layer formation, the metal cations involved in forming the layer originate from the base material, the metal cations from the phosphate solution are not involved in layer creation.

In the phosphatizing procedure that results in layer formation, the layer is formed by metal cations from the phosphate solution, and metal cations from the base material may also be involved. Layer thicknesses range from a few hundred nanometers in the case of iron phosphatizing up to two micrometers and more in the case of zinc and manganese phosphatizing.

The phosphate layer produced in this way bonds very well to the subsurface, and with the microporous or microcapillary layer structure thereof allows a good anchoring of layers to be applied subsequently. Moreover, the phosphate layer makes it more difficult for under-rust to form at imperfect sites of the coating. On their own, phosphate layers provide usable, temporary protection from corrosion, which is often sufficient for storage between processing steps. Applications are also known in which phosphatizing is used to provide permanent corrosion protection.

The phosphate layers also have good sliding properties. This has a beneficial effect when cold forming steel, for example. In this context, zinc phosphate layers are used for preference because they are easily sheared off. On the other hand, manganese phosphate layers are used to reduce wear on heavily loaded sliding pairs.

The high electrical resistance of phosphate layers is used to provide at least partial electrical insulation. For example, the phosphate layer may be implemented in magnetic steel sheets for magnet cores, to insulate them from each other with a thin separating layer.

A method for passivating a metal surface is also known in which complex salts of chromic acid (chromates) are formed on metal surfaces by the action of chromic acid. Said method is referred to as chromatizing.

In chromatizing too, the base material of the metal surface is dissolved. The metal ions released from the base material are then incorporated in the chromate layer. Like the phosphate layers, the chromate layers obtained in this way are considered to be passivating layers, that is to say they are inorganic, non-metallic protective layers.

Chromate layers are used most frequently to protect against corrosion. However, they may also serve to create an adhesion base for subsequent layers, to prevent tarnishing (of silver), to reduce the visibility of fingerprints or to change appearances (luster, color). Chromatizing methods can be used on aluminum, magnesium, silver, cadmium and zinc.

One feature that is shared by all of the processes described above is that they can only be performed in wet chemical conditions, in a series of work steps and using immersion baths. Consequently, the equipment required to carry out the process is extensive. The material needs are also considerable, because a large proportion of the passivating agent used does not participate in the process.

Furthermore, it is not possible to treat defined surface areas separately, the entire workpiece must always be subjected to the wet chemical process.

This problem is encountered particularly when manufacturing components which consist of non-corroding metal sheets, for example stainless steel sheets, and the individual parts of which are joined by welding. The weld seams formed in such processes do not resist corrosion to the same extent as the metal sheet itself. Consequently, an extra corrosion protection is necessary as a passivating measure exclusively for the area of the weld seam. In wet chemical passivation, such as phosphatizing for example, the entire component must then undergo wet chemical treatment.

Examples of components of such kind would be washing machine components, dishwasher components, pipe connections and other parts that are exposed to water during operation.

Moreover, wet chemical treatment of smaller parts with a passivating agent that contains acid is more extensive if the treatment is intended to serve as a priming coat for a layer of paint or varnish.

In addition, the wet chemical treatment of in particular smaller component structures is complicated further by surface tension, the effects of which mean that the passivating agent does not reach the entire surface of recesses or indentations. As a consequence, gaps occur on the surface and may have a negative impact on the function of the component in subsequent use.

SUMMARY OF THE INVENTION

The present invention therefore addresses the technical problem of simplifying the method for passivating a metal surface known from the prior art, and rendering it more effective.

The technical problem set forth in the preceding is solved according to the invention with a method in which an atmospheric plasma beam is generated by electrical discharge in a working gas, in which an acid-containing passivating agent is introduced into the plasma beam, in which the plasma beam containing the passivating agent is applied to the metal surface, and in which a passivating salt is deposited on the metal surface by the reaction between the acid-containing passivating agent and the metal surface.

According to the invention, is has thus been found that the application of the passivating agent by means of an atmospheric plasma beam uses many synergistic effects to advantage. Before these are explained, plasma sources and the properties of plasma beams that are generated therewith will be explained.

A plasma source is understood to be a source of a plasma beam that is directed into a spatial area, wherein the shape of the plasma beam may be rounded or flat. The plasma source may also generate a rotating plasma beam if a part of the housing, preferably the outlet opening is constructed such that it is rotatable, and revolves about an axis while the plasma is generated. Then, a wide strip of wider strips is treated as said plasma source travels along a surface.

The plasma source may comprise one plasma nozzle or a plurality of plasma nozzles arranged side by side, in the manner of a plasma shower. The plasma source may comprise a fixture for a positioning at the motion device, and feed lines for the working gas and electrical voltage.

The working gas may be excited electrically with various frequencies, for example at a frequency in the microwave range in a range of or above 1 MHz or in the frequency range of from 1 to 100 kHz. The forms of voltage may vary between AC voltages and pulsed DC voltages or superimpositions thereof. The discharges are microwave discharges or high frequency spark discharges, which may take the form of discharge arcs (arc discharges) or brush discharges. Like the frequency, the voltage amplitudes are adapted to the respective geometry of the plasma nozzle and are in the range from 100 V to 10 kV, for example. Air is preferably used as the working gas, but nitrogen and inert gases such as argon, also including an addition of other gases such as hydrogen, are possible as well.

Plasma sources of such kind are able to generate relatively cool plasma beams with relatively high chemical excitation energy. The beam temperature falls as a function of its distance from the outlet opening and is in the range below 300° C., advantageously below 150° C., and preferably below 100° C. The large amount of excitation energy contained in the working gas results from the high frequency excitation in the excitation zone within the plasma source, during which only little thermal excitation takes place. Accordingly, the plasma is also called a non-thermal plasma. The temperature and activity of the plasma beam can be influenced by selecting a suitable working gas and the parameters of the electrical voltage.

The present method is not limited to the use of previously described plasma sources. For example, other plasma sources such as with other excitation mechanisms may be used, even if the plasma beams thereof have lower temperatures and lower plasma outputs. The method according to the invention may also be performed with known plasma sources of such kind.

A method for generating an atmospheric plasma beam, that is to say a plasma beam with an ambient pressure of the same magnitudes as atmospheric pressure, is known from EP 1 335 641 A1, for example. In that document, a working gas, most often air, nitrogen, forming gas (a mixture of nitrogen and hydrogen) or an inert gas, particularly argon or helium, is passed through a conduit in which a plasma beam is generated by electrical discharge, that is to say a corona discharge and/or arc discharge, by means of a high frequency high voltage.

A method for plasma polymerization using an atmospheric plasma beam is disclosed in EP 1 230 414 B1. In this method, a precursor material is introduced into the plasma beam, where it is excited by chemical and/or electronic means, with the result that polymerization of the precursor begins before, during or after the excited precursor is deposited on a surface.

According to the present invention, the acid-containing passivating agent is applied to the metal surface to be passivated by means of an atmospheric plasma beam, such that a passivating salt is deposited on the metal surface as a result of the reaction between the acid-containing passivating agent and the metal surface. This results in a number of advantages.

Firstly, feeding the passivating agent into the plasma beam causes the excitation energy contained in the plasma beam to be transferred to the passivating agent without significantly raising the temperature of the passivating agent.

Secondly, the passivating agent is caused to swirl evenly by the flow in the plasma beam, which is often already rotating, and it is thus spread evenly upon contacting the metal surface. The swirling effect created in this manner ensures that the surface is coated almost totally, including in recesses and indentations, even if they are of very small size. The swirling of the plasma beam and of the passivating agent transported therein also ensures that passivating agent that does not adhere to the surface is immediately carried off, and no post-processing or cleaning is necessary.

Moreover, the use of the plasma beam has a cleaning effect on the surface, with the result that, if the surfaces are not too heavily soiled, they do not need to undergo precleaning before the passivating agent is applied. A separate precleaning step is only necessary for heavily soiled surfaces that cannot be cleaned adequately by the plasma beam. Consequently, the number of work steps is reduced significantly compared with the wet chemical process, and in many applications passivation of the metal surface only requires a single process step.

A further advantage consists in that the metal surface is not contaminated by applying the plasma beam to the metal surface, such as occurs with wet chemical processes according to the prior art, for example, from preceding immersion baths or similar.

Accordingly, it was surprisingly discovered as part of the activities associated with the invention that depositing a passivating agent on a metal surface by means of an atmospheric plasma beam represents an effective alternative to the known wet chemical process.

In preferred manner, an aqueous phosphoric acid may serve as the passivating agent, and metal phosphate may be deposited on the metal surface. Similarly, a chromic acid may be used as the passivating agent, and metal chromate may be deposited on the metal surface. In both cases, the bond described above between acid anions and metal cations is produced and the respective metal salt is formed as a phosphate or chromate, respectively.

Mainly, two positive effects are combined with this method.

Firstly, the acid anion in the phosphoric or chromic acid is excited by the plasma beam itself and placed in a reactive state, without inducing an excessively elevated temperature in the acid component of the plasma beam. Secondly, the metal surface itself is activated by the plasma beam, and this increases the reactivity of the metal surface and the necessary metal cations are generated more easily during the chemical reaction with the acid anions. Thus, the desired reaction and precipitation of the metal salt is achieved in the area where the plasma beam impinges the metal surface.

The reactivity of the acid ions may also be adjusted, in particular by making a corresponding alteration to the plasma generation parameters. By selecting these parameters appropriately, the length of the treatment time with the plasma beam can be reduced. The treatment times that are achieved thereby are significantly shorter than the treatment times required for wet chemical processes.

The acid-containing passivating agent that is fed into the plasma beam, that is to say the aqueous acid solution, may or may not contain metal ions. For example, chromatizing can be carried out with sulphuric acid and sodium chromate. The chromic acid formed thereby then reacts with the surface. On the other hand, if phosphoric acid is used as a passivating agent, the passivating agent contains no metal ions. The reaction between the acid and the surface then results for example in the formation of a metal chromate or a metal phosphate.

The precise details of the chemical and physical processes that are set in motion when the plasma beam is fed with a passivating agent have not yet been fully determined. At all events, it has been found, surprisingly, that the metal surfaces that are subjected to the procedures described in the foregoing have undergone passivation that is sufficient for the purposes of industrial manufacturing.

The approach described in the following is therefore provisional. In the method according to the invention, the acid is excited in the plasma before it is applied, and consequently it reacts with the surface much more quickly. The previously described cleaning and activation of the surface that also takes place at the same time has a positive effect on the reaction speed.

Classic, wet chemical chromatization usually consists of two essential steps. First, the oxide layer (aluminum hydroxide) is completely removed with caustic soda. Then, the chromatizing process is carried out immediately after rinsing with water. With the method according to the invention with the use of plasma, there is no need to remove the oxide layer. Consequently, the subsequent passivation of the material takes place directly on the oxide layer.

As was noted earlier, phosphatization can be carried out in particular on steel and stainless steel, but equally on zinc or cadmium plated steels and aluminum. Meanwhile, chromatizing may be carried out in particular on aluminum, magnesium, silver, cadmium and zinc.

A further advantage of the method described in the preceding consists in that the use of passivation, for example by phosphatizing, can be applied selectively to specific areas of the surface. An example of such in this context would be the weld seams between adjoining sheets of stainless steel, such as are conventionally used for drums and internal paneling in washing machines or dishwashers. Since the stainless steel sheets themselves are already sufficiently protected against corrosion, but the weld seams are no longer adequately resistant to corrosion because of the changes to the microstructure within the metal, there is a need to carry out subsequent passivation only in the area of the weld seams. Thus, the method described in the preceding is carried out preferably in such manner that the plasma beam is applied at least to the weld seam between two metal surfaces.

The plasma beam may be applied to the metal surface preferably during or immediately after the welding operation. In this case, the thermal energy that is still stored in the weld seam and the adjacent metal can be used to increase the reactivity of the metal surface and so enhance the effectiveness of the passivation. Moreover, it is also possible to implement the described method with a weld seam that has cooled down.

Besides the narrow spatial application of the plasma beam, for example to a weld seam, the method described may also be carried out in such manner that the application of the passivating agent to the metal surface is performed in order to create a priming layer for a subsequent application of a coat of paint or varnish. In this case, treatment is carried out of a wide area, particularly the full area of the metal surface. The subsequent coating with paint or varnish then yields good adhesion and a durable coat. The rotating plasma nozzles described in the preceding are particularly suitable for such an application.

The passivating agent may be introduced into the plasma beam in various ways. Since the generation of the plasma beam from a working gas stream passes through various spatial areas, starting from the discharge area through the nozzle area, and the free beam outside of the plasma source, the passivating agent can be added to the plasma beam in any of these spatial areas.

In this way, the passivating agent may preferably be introduced into the developing plasma beam in the discharge area. In this case, the working gas is excited together with the passivating agent by means of electrical discharge. Thus, the effect of the discharge on the passivating agent is very strong, and it depends on the nature of the passivating agent whether such is suitable for the direct effect of the discharge.

The passivating agent may also be fed into the developed plasma beam downstream from the discharge area. On the one hand, the passivating agent can still be introduced into the stream of the plasma beam inside the plasma source, before the beam exits through the plasma nozzle. On the other hand, the passivating agent may also be fed into the plasma beam outside the plasma source. In the latter case, the passivating agent only comes into slight contact with the plasma source, or not at all, so that influences by the acid component on the parts of the plasma source may be minimized.

In order to ensure that the passivating agent is distributed more evenly, it may advantageously be introduced via an atomizing nozzle. In this way, a fine, uniform distribution is already achieved when the passivating agent is introduced into the working gas or the plasma beam, respectively, the positive effect of which is retained until the plasma beam is applied to the metal surface. But the passivating agent can also be added to the plasma beam in other ways.

BRIEF DESCRIPTION OF THE DRAWINGS

In the following, the invention will be explained in greater detail with respect to exemplary embodiments thereof, wherein reference will be made to the accompanying drawing. In the drawing.

DETAILED DESCRIPTION OF THE INVENTION

In the following, the application of the method according to the invention will be explained with reference to three exemplary embodiments thereof, which differ from one another with regard to the area of the plasma nozzle in which the acid-containing passivating agent is introduced. Accordingly, the same reference signs are used to identify the same elements in the different embodiments.

Figure 1:
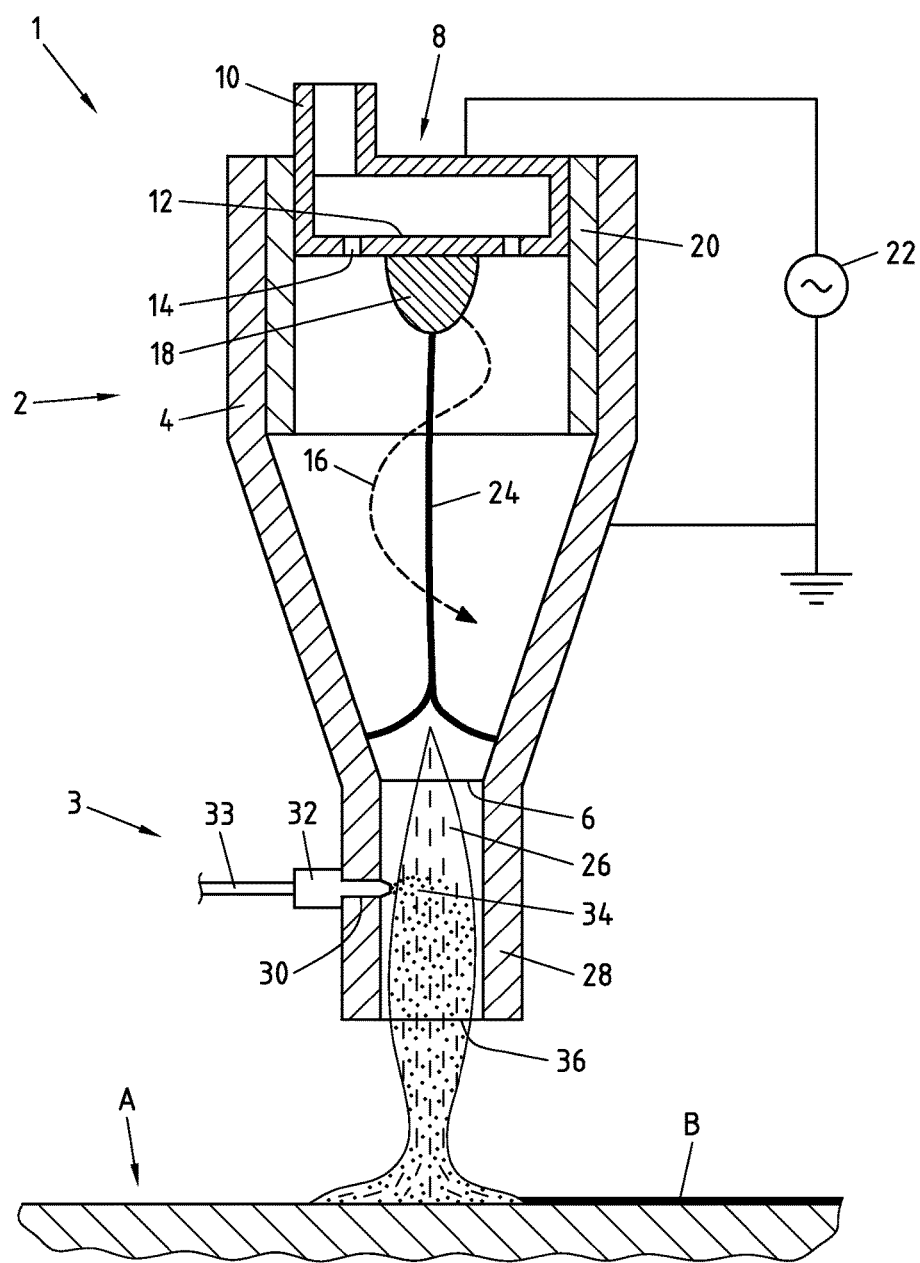
FIG. 1 shows a first exemplary embodiment of a device according to the invention for passivating a surface, in which a passivating agent is introduced into the plasma beam in the area of the nozzle opening.

FIG. 1 shows a plasma source 2 and a supply device 3. Plasma source 2 comprises a nozzle tube 4 made from metal that tapers conically to form a nozzle opening 6. At the opposite end to nozzle opening 6, nozzle tube 4 has a swirl device 8 with an inlet 10 for a working gas, such as air or nitrogen gas. A dividing wall 12 of the swirl device 8 has a garland of boreholes 14 arranged transversally in the circumferential direction, via which the working gas is swirled. Consequently, as the working gas flows through the conically tapered part of the nozzle tube downstream, it rotates in a vortex 16, the core of which follows the longitudinal axis of nozzle tube 4.

An electrode 18 is arranged in the center of the underside of dividing wall 12, and protrudes into nozzle tube 4 coaxially into the direction of the tapered section. Electrode 18 is electrically connected to dividing wall 12 and the other parts of swirl device 8. Swirl device 8 is electrically insulated from nozzle tube 4 by a ceramic tube 20. A high frequency high voltage generated by a transformer 22 is applied to electrode 18 via swirl device 8. Inlet 10 is connected to a working gas source with variable flow rate via a hose, which is not shown in the figure. Nozzle tube 4 is earthed. The applied voltage causes a high frequency discharge in the form of an arc discharge 24 between electrode 18 and nozzle tube 4. In this context, the term "arc discharge" is used as a phenomenological description of the discharge, because the discharge occurs in the form of an arc. The term "arc discharge" is also used for a discharge form of DC voltage discharges having essentially constant voltage values.

Due to the swirling flow of the working gas, this arc discharge is channeled on the axis of nozzle tube 4 in the core of the vortex, with the result that it does not branch off toward the wall of nozzle tube 4 until it reaches the area of nozzle opening 6. The working gas, which is rotating with a high flow speed in the area of the vortex core and thus in the immediate proximity of arc discharge 24, is in close contact with arc discharge 24, so that a part thereof is converted to the plasma state, with the result that an atmospheric plasma beam 26 exits plasma source 2 through nozzle opening 6.

Feed device 3 comprises a mixer tube 28, the wall of which has an opening 30 in one place, in which an atomizer 32 fits tightly. A feed 33 for supplying the passivating agent is connected to the atomizer 32, and the passivating agent passes through said feed to reach atomizer 32, where it is atomized to form a fine mist.

The passivating agent that exits atomizer 32 immediately gets into the plasma beam 26 and is entrained thereby toward metal surface A. The passivating agent then arrives on metal surface A in the manner described in the preceding, so that a passivation layer B is formed. For example, if phosphoric acid is used as the passivating agent, a metal phosphate layer is formed in passivation layer B.

The thickness of the passivation layer may vary, and it is influenced by the operating parameters. Inter alia the thickness of the passivation layer depends on the quantity of passivating agent that is introduced into the plasma beam. In the case of dilute phosphate acid, an application rate of about 50 g/h was found to be favorable.

Figure 2:
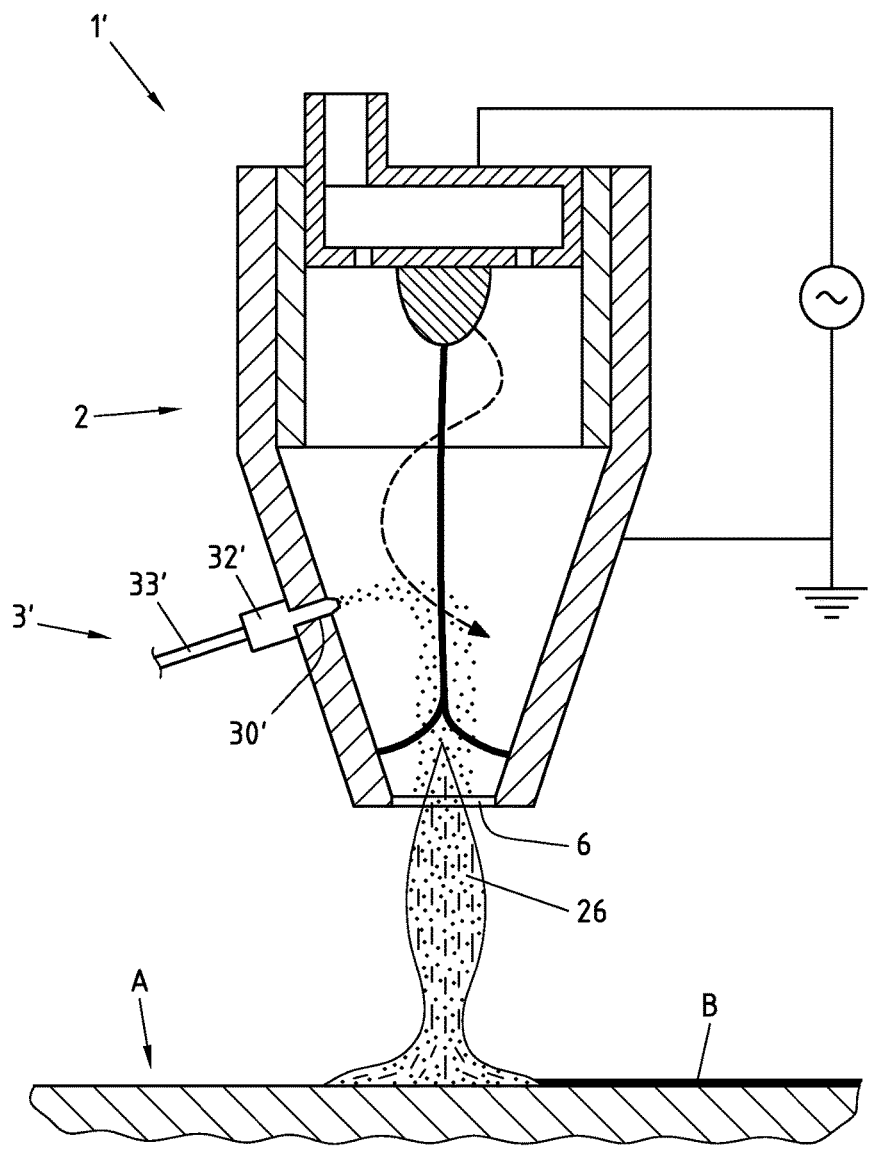
FIG. 2 shows a second exemplary embodiment of a device according to the invention for passivating a surface, in which a passivating agent is introduced into the plasma beam in the area of the discharge volume.

FIG. 2 shows a second embodiment of a device for passivating a surface. The device comprises a plasma source 2 for generating a plasma beam 26 as described previously with reference to FIG. 1, and a feed device 3' with an atomizer nozzle 32' in the conically tapered area of nozzle tube 10. In this case, the passivating agent is thus introduced into the area of the plasma source in which the arc discharge is ignited and powered. Here too, the wall of nozzle tube 10 has an opening 30' at a certain location, into which atomizer 32' fits perfectly. A feed 33' is connected to atomizer 32' for supplying the passivating agent, through which the passivating agent passes to reach the atomizer 32', where it is atomized to form a fine mist.

Figure 3:
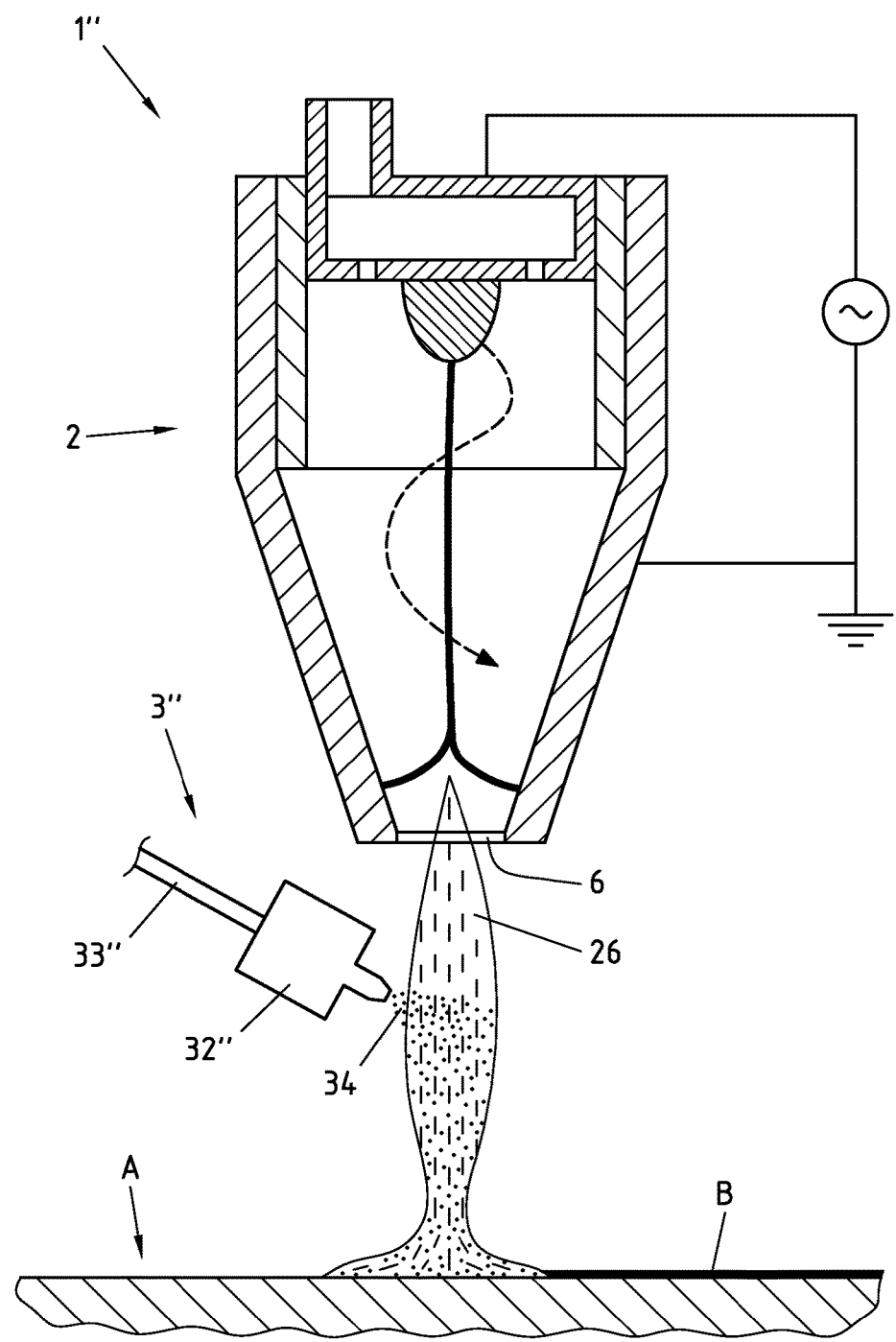
FIG. 3 shows a third exemplary embodiment of a device according to the invention for passivating a surface, in which a passivating agent is introduced into the plasma beam in the area before the nozzle opening.

FIG. 3 shows a third embodiment of a device for plasma passivating a metal surface. The device comprises a plasma source 2 for generating a plasma beam 26 as described previously with reference to FIGS. 1 and 2, and an atomizer 32" positioned downstream of nozzle opening 6. A feed 33" is connected to atomizer 32", and the passivating agent passes through said feed to reach atomizer 32" where it is atomized. The passivating agent that exits atomizer 32" gets into the plasma beam 26 generated in plasma source 2 and exiting through nozzle opening 6, and is transported onward with the plasma beam 26.

In each of the figures described, the plasma source is moved from right to left over the surface, so that a passivation track is created on the metal surface having the same width as the treatment width of the plasma beam. The passivation track may be used to passivate a weld seam. The passivation track may also be used for planar passivation of a metal surface, if the plasma source is moved, where applicable systematically, over the entire metal surface that is to be passivated.

The invention claimed is:

1. A method for passivating a metal surface comprising the steps of:
   generating an atmospheric plasma beam by electrical discharge in a working gas,
   introducing an acid-containing passivating agent into the plasma beam,
   applying the plasma beam containing the passivating agent to the metal surface, and
   depositing a passivating salt on the metal surface by a reaction between the acid-containing passivating agent and the metal surface.

2. The method according to claim 1, wherein phosphoric acid is used as the passivating agent and metal phosphate is deposited on the metal surface.

3. The method according to claim 1, wherein chromic acid is used as the passivating agent and metal chromate is deposited on the metal surface.

4. The method according to claim 1, wherein the metal surface comprises a weld seam, and the plasma beam is applied at least to the weld seam.

5. The method according to claim 4, wherein the plasma beam is applied to the metal surface during or immediately after the welding operation.

6. The method according to claim 1, wherein the passivating agent is applied to the metal surface to create a priming layer for a subsequent application of a coat of paint or varnish.

7. The method according to claim 1, wherein the passivating agent is fed into the developing plasma beam in a discharge area.

8. The method according to claim 1, wherein the passivating agent is fed into the developed plasma beam downstream from a discharge area.

9. The method according to claim 7, wherein the passivating agent is introduced via an atomizer nozzle.

10. The method according to claim 2, wherein the phosphoric acid is diluted.

11. The method according to claim 3, wherein the chromic acid is diluted.

* * * * *

UNITED STATES PATENT AND TRADEMARK OFFICE
CERTIFICATE OF CORRECTION

PATENT NO. : 9,771,652 B2  
APPLICATION NO. : 14/388493  
DATED : September 26, 2017  
INVENTOR(S) : Christian Buske et al.

Page 1 of 1

It is certified that error appears in the above-identified patent and that said Letters Patent is hereby corrected as shown below:

On the Title Page

Column 1, Item (71) Applicants, Lines 2 and 3, delete "BSH Bosch und Siemens Hausgerate GmbH, Munich (DE)"

Signed and Sealed this  
Fifteenth Day of May, 2018

Andrei Iancu  
*Director of the United States Patent and Trademark Office*